United States Patent [19]

Hashemi et al.

[11] Patent Number: 5,640,025

[45] Date of Patent: Jun. 17, 1997

[54] HIGH FREQUENCY SEMICONDUCTOR TRANSISTOR

[75] Inventors: Majid M. Hashemi; Saied N. Tehrani, both of Tempe, Ariz.

[73] Assignee: Motorola, Schaumburg, Ill.

[21] Appl. No.: 566,386

[22] Filed: Dec. 1, 1995

[51] Int. Cl.⁶ ............... H01L 31/0328; H01L 31/0336; H01L 31/072; H01L 31/109
[52] U.S. Cl. ............... 257/183; 257/197; 257/198
[58] Field of Search .................. 257/197, 198, 257/183

[56] References Cited

FOREIGN PATENT DOCUMENTS

| | | | |
|---|---|---|---|
| 0206787 | 12/1986 | European Pat. Off. | 257/197 |
| 63-248168 | 10/1988 | Japan | 257/197 |
| 1241867 | 9/1989 | Japan | 257/197 |
| 1251660 | 10/1989 | Japan | 257/197 |
| 3138949 | 6/1991 | Japan | 257/198 |

*Primary Examiner*—William Mintel
*Attorney, Agent, or Firm*—Eugene A. Parsons

[57] ABSTRACT

A high frequency transistor including a heavily doped first current carrying layer positioned on a substrate and a semi-insulating layer of LTGaAs epitaxially grown on the first layer. The semi-insulating layer is etched, using a layer of AlAs as an etch stop, to define an active region and a first current carrying electrode is grown on the exposed first layer in the active region. A control layer is grown on the semi-insulating layer and the first current carrying electrode, and a second current carrying electrode is grown on the control layer. External contacts are formed on the first current carrying layer, the control layer, and the second current carrying electrode.

10 Claims, 3 Drawing Sheets

HIGH FREQUENCY SEMICONDUCTOR TRANSISTOR

FIELD OF THE INVENTION

The present invention pertains to semiconductor transistors and more specifically to high frequency bipolar semiconductor transistors.

BACKGROUND OF THE INVENTION

Because of the increase in communications and data handling and the increase in operating systems for handling these, it is becoming increasingly important to raise the frequencies at which the various systems operate. To raise the frequencies of the operating systems, it is necessary to increase the upper or maximum frequencies of the devices used in the various systems.

In one example, heterojunction devices, such as heterojunction bipolar transistors (HBTs), can be made very small, which greatly reduces internal capacitances, such as intrinsic base-collector capacitance. However, because external base contacts must be made large enough for low resistance external contact, the extrinsic base-collector capacitance is usually 10–15 times as large as the intrinsic base-collector capacitance and substantially reduces the maximum frequency of the device.

Accordingly, it is highly desirable to provide a bipolar transistor with a lower extrinsic base-collector capacitance, or higher maximum operating frequency.

It is a purpose of the present invention to provide a new and improved bipolar transistor.

It is another purpose of the present invention to provide a new and improved heterojunction bipolar transistor with substantially reduced extrinsic base-collector capacitance.

It is a further purpose of the present invention to provide a new and improved bipolar transistor with a substantially increased maximum operating frequency.

It is still a further purpose of the present invention to provide a new and improved bipolar transistor with a substantially increased maximum operating frequency fabricated by a highly controllable process.

SUMMARY OF THE INVENTION

The above problems and others are at least partially solved and the above purposes and others are realized in a method of fabricating a high frequency transistor including forming a heavily doped first current carrying layer on a substrate and epitaxially growing an etch stop layer and a layer of semi-insulating material on the first current carrying layer. The semi-insulating layer is etched, using a mask layer and the etch stop, which is used for accurate and reproducible thickness, to define an active region by exposing a portion of the first current carrying layer. A first current carrying electrode is grown on the exposed portion of the first current carrying layer in the active region. After removing the mask layer, a control layer is grown on the semi-insulating layer and the first current carrying electrode, and a second current carrying electrode is grown on the control layer in the active region. External contacts are formed on the first current carrying layer, the control layer, and the second current carrying electrode to complete the semiconductor transistor.

As a typical example, the semiconductor transistor may be a high frequency heterojunction bipolar transistor.

BRIEF DESCRIPTION OF THE DRAWINGS

Referring to the drawings.

DESCRIPTION OF THE PREFERRED EMBODIMENTS

Figure 1:
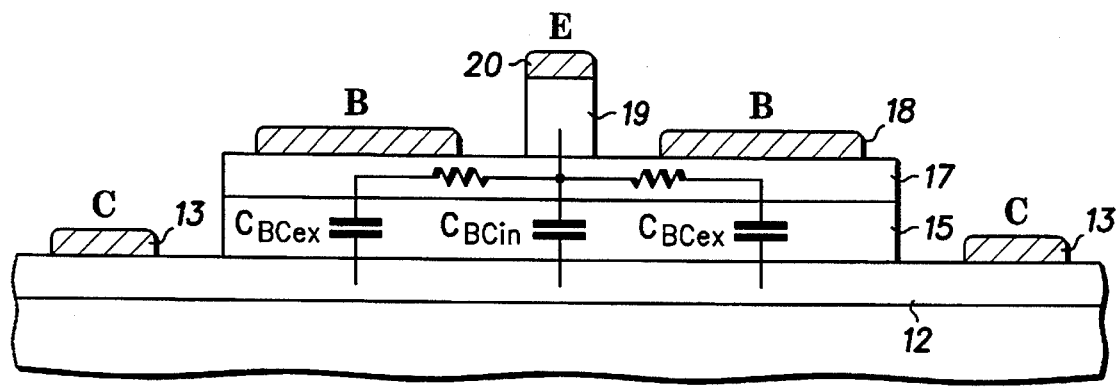
FIG. 1 is a simplified semi-schematic view illustrating several capacitances in a bipolar transistor.

Referring initially to FIG. 1, a simplified semi-schematic view of a bipolar transistor including several capacitances which determine the maximum operating frequency is illustrated. Briefly, a conducting layer 12, having external metal collector contacts 13 on opposite sides thereof, has a collector layer 15 positioned thereon. A base layer 17 is positioned on collector layer 15 to form a base and has external metal base contacts 18 affixed to opposite sides thereof. An emitter layer 19 is positioned on layer 17 between base contacts 18 and an external metal emitter contact 20 is positioned thereon.

As can be seen from FIG. 1, intrinsic base-collector capacitance $C_{BCin}$ is the capacitance produced as a result of the active portion of the base positioned directly under emitter contact 20. The extrinsic base-collector capacitance $C_{BCex}$ is the capacitance produced by the portion of the base required to support the external metal contacts (non-active portion) positioned adjacent to emitter contact 20.

In a conventional heterojunction bipolar transistor, the non-active area of collector layer 15 is damaged by ion implants, such as O+ or H+, to reduce the extrinsic base-collector capacitance $C_{BCex}$. However, since base layer 17 must be epitaxially grown before damaging collector layer 15, in a heterojunction bipolar transistor to achieve proper crystalline lattice matched material, this process also damages base layer 17, which substantially increases the base resistance $R_B$, thereby reducing the maximum operating frequency.

As is known in the art, the equation for the maximum operating frequency $f_{MAX}$ is:

$$f_{max} \sim \sqrt{\frac{f_\tau}{8\pi R_B C_{BC}}}$$

where $f_{MAX}$ is the power gain cut-off frequency and $f_t$ is the current gain cut-off frequency. Thus, when $C_{BC}$ is reduced but $R_B$ is simultaneously increased, much of the advantage is lost.

Figure 2:
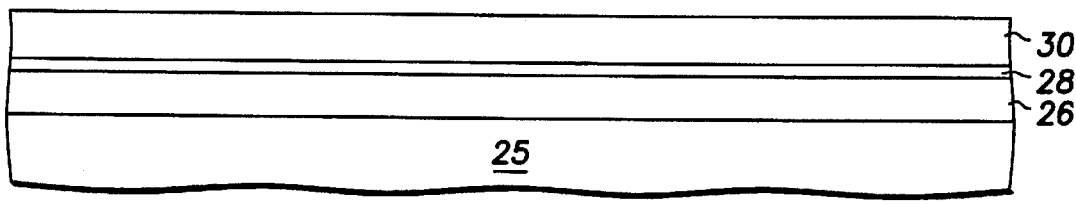
FIGS. 2–7 illustrate several sequential steps in the fabrication of a bipolar transistor in accordance with the present invention.

Turning now to FIGS. 2–7, several sequential steps in the fabrication of a bipolar transistor in accordance with the present invention are illustrated. Referring specifically to FIG. 2, a substrate 25, which in this specific embodiment is gallium arsenide (GaAs), has a heavily doped contact layer 26 positioned thereon, for example, by epitaxial growth. As will be explained presently, contact layer 26 is heavily doped to provide a relatively good conductor for supporting external metal current carrying contacts. An etch stop layer 28 is then positioned on layer 26, for example, by epitaxial growth. A semi-insulating layer 30 of an epitaxially grown dielectric material is then grown on etch stop layer 28. In this specific example, semi-insulating layer 30 is formed of a low temperature GaAs, which is grown at a temperature in the range of approximately 150° C. to 200° C. Also, etch stop layer 28 is formed of any material with a sufficiently different etch rate to allow selective etching of semi-insulating layer 30, which in this specific example is aluminum arsenide (AlAs). Because low temperature GaAs after in-situ annealing at temperatures around 600° C. behaves as a good dielectric, and will eliminate depletion layer modulation and consequently the associated capacitance, the use of this material is preferred in the present invention.

Figure 3:
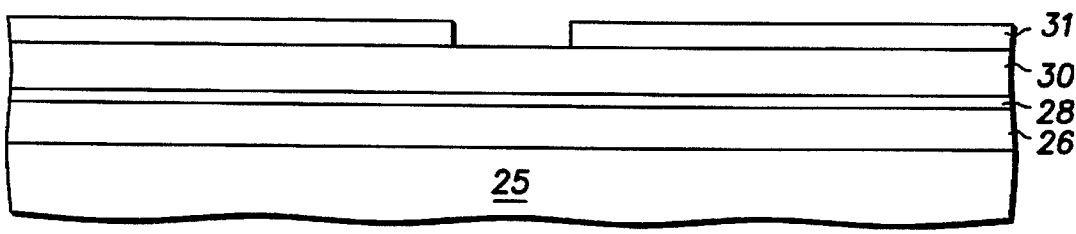
Figure 4:
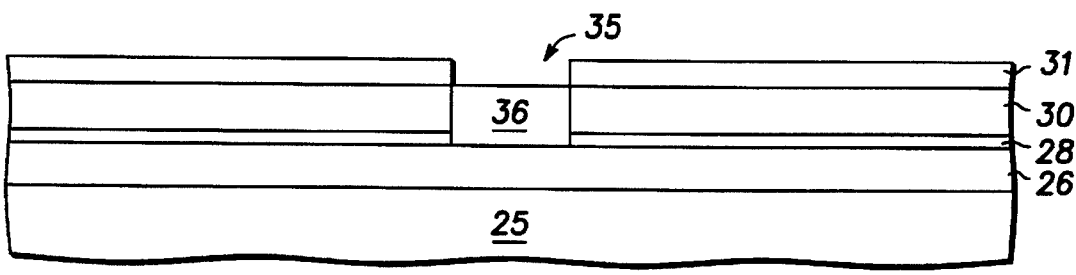

Subsequent to the epitaxial growth of semi-insulating layer 30, an etch mask 31 is formed on the upper surface of semi-insulating layer 30, as illustrated in FIG. 3. Etch mask 31 is formed in any of the well known processes, such as chemical vapor deposition techniques, generally involving patterned photoresist or the like, and is sufficiently strong to resist etching of semi-insulating layer 30 and subsequent removal of a portion of etch stop layer 28, to be explained. In this specific example, etch mask 31 is formed of silicon nitride ($Si_3N_4$), but it will be understood that many other materials might be utilized and that this is only for purposes of this example. With etch mask 31 in place and properly defining an active region for the transistor being fabricated, a portion of semi-insulating layer 30 is selectively etched away, as illustrated in FIG. 4, to define an active region 35 (in this specific example a centrally located trench) for the transistor being fabricated. At this point the portion of etch stop layer 28 positioned in active region 35 is also removed, either in the same etch process or by using a different etching process. Because etch stop layer 28 is formed of material having a different etch rate than the material of semi-insulating layer 30, this etching process is greatly simplified, as well as highly repeatable and the thickness of the layers is precisely controlled.

Figure 5:
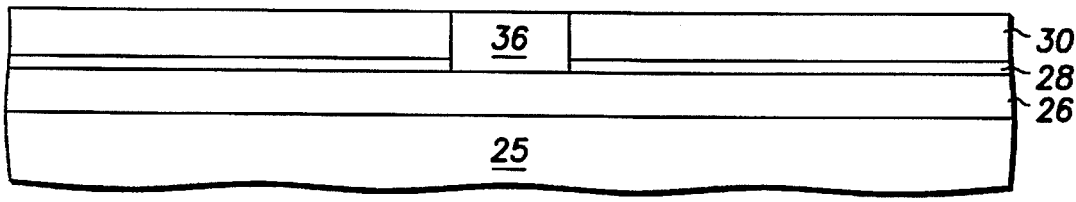
Figure 6:
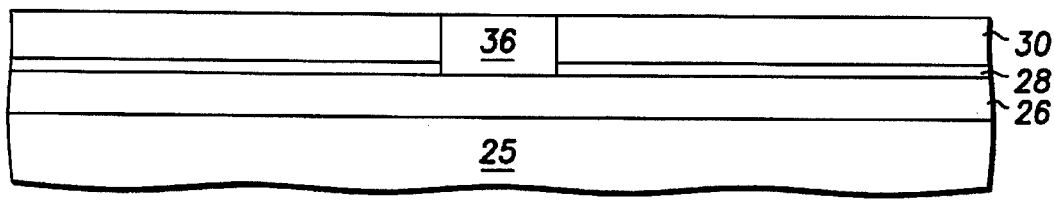

Referring now to FIG. 5, a current carrying electrode 36 is formed on the exposed portion of contact layer 26 in active region 35. Current carrying electrode 36 is a layer of lightly doped material epitaxially grown on and crystal lattice matched to contact layer 26. Here it should be noted that the thickness and doping product of current carrying electrode 36 affects power and frequency performance of the device, specifically when the device is a bipolar device. In this specific example the material of current carrying electrode 36 is lightly doped GaAs to provide n-conduction and serves as the collector of the transistor. Current carrying electrode 36 is grown to a depth approximately equal to the depth of semi-insulating layer 30 so that the upper surfaces of the two layers are approximately planar, after the removal of etch mask 31, as illustrated in FIG. 6. Because epitaxial growth can be very accurately controlled, the process of growing current carrying electrode 36 to the same depth (or height) as semi-insulating layer 30 is accurate and reproducible.

Figure 7:
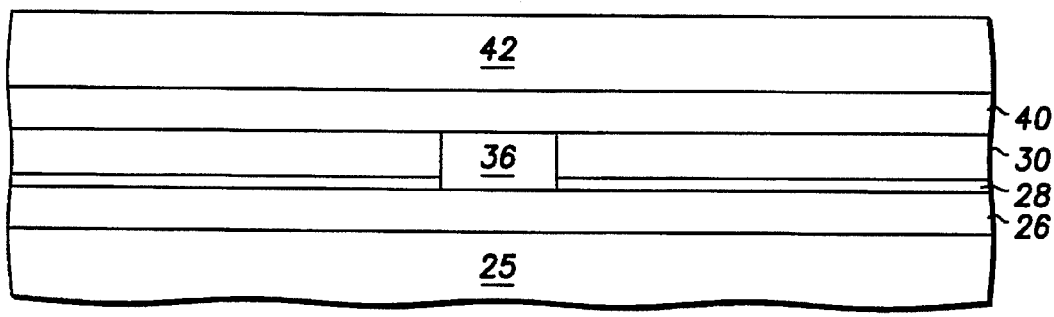

Once etch mask 31 is removed, a control layer 40 is positioned on the planar upper surface of current carrying electrode 36 and semi-insulating layer 30, as illustrated in FIG. 7. Control layer 40 is heavily doped with material that produces an opposite type of conductivity in current carrying electrode 36 to produce the appropriate semiconductor junction. In this specific example, control layer 40 forms a base and is heavily doped for p-conduction. Control layer 40 can be epitaxially grown on the planar surface and is crystal lattice matched to the material of current carrying electrode 36 and semi-insulating layer 30.

A second current carrying layer 42 is positioned on the surface of control layer 40, as illustrated in FIG. 7. Current carrying layer 42 is lightly doped for the same type of conduction as current carrying electrode 36, in this specific example n-conduction, and forms the proper semiconductor junction with control layer 42. In this specific example, current carrying layer 42 is the emitter electrode for the transistor and the material forming current carrying layer 42 is crystal lattice matched to the material forming control layer 40.

Figure 8:
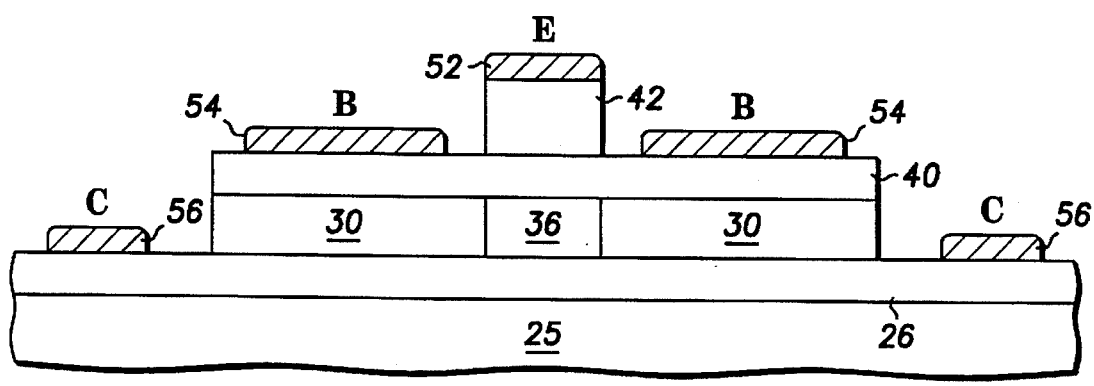
FIG. 8 illustrates a completed bipolar transistor fabricated by the steps illustrated in FIGS. 1–7.

Referring now to FIG. 8, a complete bipolar transistor 50 is illustrated in a simplified view. In this specific example where transistor 50 is a heterostructure bipolar transistor, substrate 25 is GaAs, contact layer 26 is GaAs heavily doped for n-type conduction and serves as a sub-collector, semi-insulating layer 30 is low temperature GaAs, and current carrying electrode 36 is lightly doped GaAs which serves as the collector. Control layer 40 is heavily doped for p-type conduction and serves as the base electrode, and current carrying layer 42 serves as the emitter electrode.

As can be seen, portions of current carrying layer 42 have been removed to form a current carrying electrode only in the active region of transistor 50. An external electrical contact 52, generally a metal ohmic contact, is formed on the upper surface of current carrying layer 42, which in this specific example is the emitter contact. Also, external electrical contacts 54, generally metal ohmic contacts, are formed on the upper surface of control layer 40 on either side of current carrying layer 42, which in this specific example are the base contacts. Further, portions of control layer 40, semi-insulating layer 30, and etch stop layer 28 are removed, leaving only sufficient room to accommodate external electrical contacts 54. If the removal process includes etching, the external electrical contacts 52 and 54 are generally covered with photoresist or other etch mask. Finally, external electrical contacts 56, generally metal ohmic contacts, are formed on the upper surface of contact layer 26 on either side of semi-insulating layer 30, which in this specific example are the collector contacts.

Figure 9:
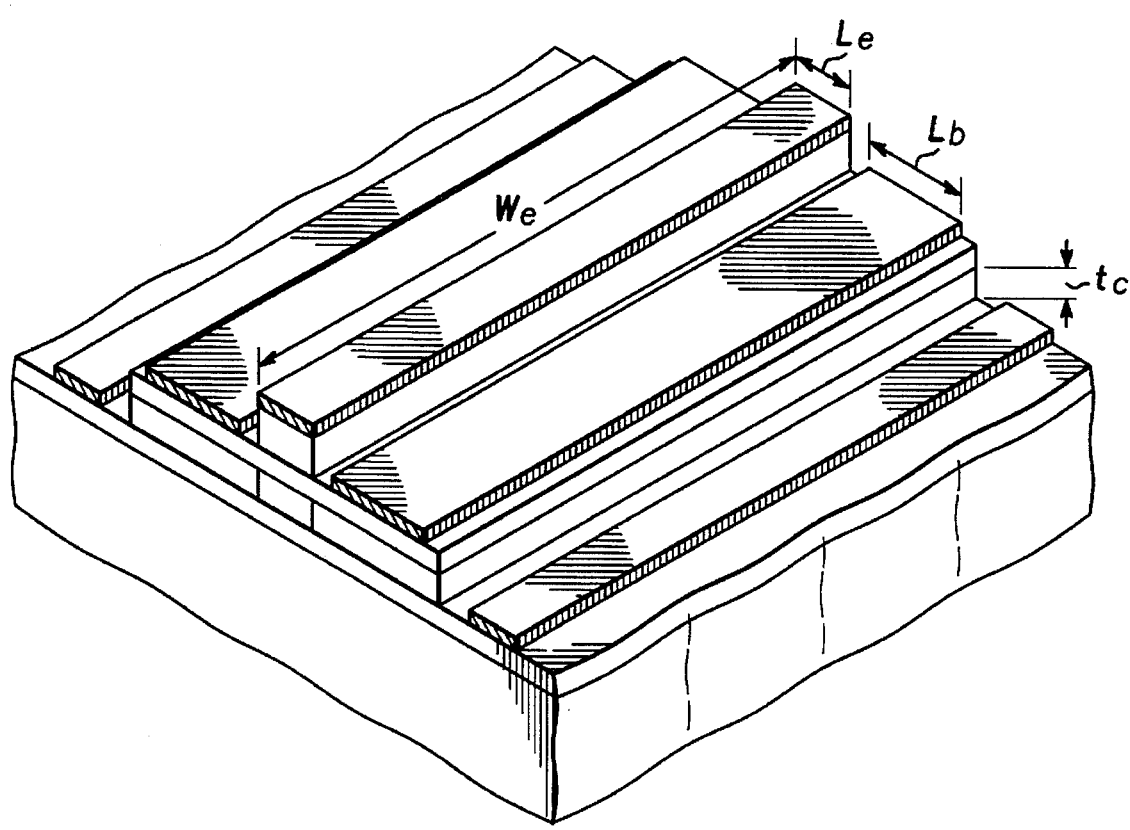
FIG. 9 is a simplified isometric view of the bipolar transistor of FIG. 8 illustrating various measurements utilized to calculate the size of the various capacitances.

Referring now to FIG. 9, a simplified isometric view of bipolar transistor 50 of FIG. 8 is illustrated, including various measurements utilized to calculate the size of the various capacitances within bipolar transistor 50 (which calculations are known and will not be detailed herein). In a specific example utilized to illustrate some of the advantages of the present invention, $L_e$ is equal to approximately 2 microns, $L_b$ is equal to approximately 3 microns, $t_c$ is equal to approximately 0.4 microns, and $W_e$ is equal to approximately 10 microns. Utilizing the well known calculations, the capacitances in the conventional bipolar transistor described above (in conjunction with FIG. 1) are:

$C_{BCin}$=5.7 pF;

$C_{BCex}$=17.2 pF; and $C_p$=0.5 pF, where $C_p$ is the pad capacitance of the device.

The result is that in a conventional bipolar transistor of the above described size, $C_{BC}$ is 23.4 pF, while in bipolar transistor 50 utilizing low temperature GaAs as semi-insulating layer 30, $C_{BC}$ is equal to 6.2 pF. Introducing this information into the above equation for the maximum operating frequency, $f_{MAX}$ for the conventional bipolar transistor is approximately equal to 60 GHz while the maximum operating frequency, $f_{MAX}$ for the bipolar transistor fabricated in accordance with the present invention is greater than 100 GHz.

Thus, new and improved semiconductor transistors and methods of fabrication are described which substantially increase the maximum operating frequency of the transistors. The maximum operating frequency is increased because the process does not require the damaging of the collector material by implant, which also results in damage to the base layer. Further, the dielectric material utilized is consistent, reproducible, and substantially reduces the extrinsic base-collector capacitance. Also, the new and improved bipolar transistor with substantially increased maximum operating frequency is easily fabricated by a highly controllable and repeatable process.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A high frequency semiconductor transistor comprising:

a substrate;

a doped first current carrying layer positioned on the substrate;

a layer of semi-insulating material epitaxial grown on the first current carrying layer and patterned to form an opening therethrough defining an active region for the transistor with the first current carrying layer being exposed in the active region;

a first current carrying electrode epitaxially grown on the exposed first current carrying layer in the active region;

a control layer positioned on the semi-insulating layer and the first current carrying electrode;

a second current carrying electrode positioned on the control layer; and a first external contact positioned on the first current carrying layer, a second external contact positioned on the control layer and a third external contact positioned on the second current carrying electrode.

2. A high frequency semiconductor transistor as claimed in claim 1 wherein the substrate includes a GaAs substrate.

3. A high frequency semiconductor transistor as claimed in claim 1 wherein the first current carrying layer includes an epitaxially grown layer of doped first conductivity material.

4. A high frequency semiconductor transistor as claimed in claim 1 wherein the layer of semi-insulating material includes an epitaxially grown layer of Low Temperature GaAs.

5. A high frequency semiconductor transistor as claimed in claim 1 wherein the layer of semi-insulating material includes material which operates as an etch stop.

6. A high frequency semiconductor transistor as claimed in claim 5 wherein the doped first conductivity material includes an epitaxially grown doped layer of GaAs.

7. A high frequency semiconductor transistor as claimed in claim 6 wherein the first current carrying electrode includes a regrown layer of doped first conductivity GaAs grown on the doped layer of GaAs.

8. A high frequency semiconductor transistor as claimed in claim 1 wherein the control layer includes a layer of material doped with an opposite conductivity to the first conductivity.

9. A high frequency semiconductor transistor as claimed in claim 1 wherein the second current carrying electrode includes growing a layer of material doped with the first conductivity.

10. A high frequency semiconductor transistor as claimed in claim 9 wherein the doped first conductivity material includes material doped with n-conductivity and the layer of material doped with the opposite conductivity includes material doped with p-conductivity.

* * * * *